(12) United States Patent
Hata et al.

(10) Patent No.: US 12,308,356 B2
(45) Date of Patent: May 20, 2025

(54) SEMICONDUCTOR DEVICE INCLUDING SEMICONDUCTOR CHIP HAVING POWER TRANSISTOR AND TEMPERATURE SENSING DIODE

(71) Applicant: Renesas Electronics Corporation, Tokyo (JP)

(72) Inventors: Toshiyuki Hata, Tokyo (JP); Zen Tomizawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 18/588,573

(22) Filed: Feb. 27, 2024

(65) Prior Publication Data

US 2024/0312968 A1   Sep. 19, 2024

(30) Foreign Application Priority Data

Mar. 13, 2023   (JP) ................. 2023-038893

(51) Int. Cl.
*H01L 25/16* (2023.01)
*H01L 23/00* (2006.01)
*H01L 23/34* (2006.01)
*H01L 23/495* (2006.01)

(52) U.S. Cl.
CPC ............. *H01L 25/16* (2013.01); *H01L 23/34* (2013.01); *H01L 23/49524* (2013.01); *H01L 24/40* (2013.01); *H01L 24/83* (2013.01); *H01L 2224/40221* (2013.01); *H01L 2224/83192* (2013.01); *H01L 2924/13091* (2013.01)

(58) Field of Classification Search
CPC ... H01L 23/49524; H01L 24/40; H01L 24/83; H01L 25/16; H01L 23/34
See application file for complete search history.

(56) References Cited

U.S. PATENT DOCUMENTS

| 9,704,979 | B2 | 7/2017 | Muto et al. | |
|---|---|---|---|---|
| 2012/0292760 | A1* | 11/2012 | Narita | H01L 24/81 257/737 |
| 2015/0214213 | A1* | 7/2015 | Tonomura | H01L 27/0251 257/401 |
| 2018/0160569 | A1* | 6/2018 | Yoshihara | H05K 7/20509 |

FOREIGN PATENT DOCUMENTS

| DE | 102018120653 A1 * | 3/2019 |
|---|---|---|
| JP | 2015-2229 A | 1/2015 |

* cited by examiner

*Primary Examiner* — Lex H Malsawma
*Assistant Examiner* — Sean Ayers Winters
(74) *Attorney, Agent, or Firm* — Rimon P.C.

(57) ABSTRACT

A semiconductor device including: a first semiconductor chip having a first power transistor and a temperature sensing diode; and a second semiconductor chip having a second power transistor, but not having a temperature sensing diode.

8 Claims, 17 Drawing Sheets

SEMICONDUCTOR DEVICE INCLUDING SEMICONDUCTOR CHIP HAVING POWER TRANSISTOR AND TEMPERATURE SENSING DIODE

CROSS-REFERENCE TO RELATED APPLICATIONS

The disclosure of Japanese Patent Application No. 2023-038893 filed on Mar. 13, 2023, including the specification, drawings and abstract is incorporated herein by reference in its entirety.

BACKGROUND

The present invention relates to a technique for a semiconductor device, a method of manufacturing the semiconductor device, and a method of providing a chipset. For more particularly, the present invention relates to a technique applicable for a semiconductor device including a plurality of semiconductor chips each having a power transistor, a method of manufacturing the semiconductor device, and a method of providing a chipset (set of the semiconductor chips).

Here, there are disclosed techniques listed below.
[Patent Document 1] Japanese Unexamined Patent Application Publication No. 2015-002229

Patent Document 1 discloses a technique for a semiconductor device including a semiconductor chip having a power transistor and a temperature sensing diode.

SUMMARY

The present inventors are engaged in manufacturing and designing a semiconductor device including a plurality of semiconductor chips each having a power transistor and a temperature sensing diode. In recent years, it is required to decrease a manufacturing cost of the semiconductor device. In order to cope with this demand, the present inventors continue to study for realizing a cost reduction of the semiconductor device. That is, in case of manufacturing a semiconductor device including a plurality of semiconductor chips each having the power transistor and the temperature sensing diode, an innovation (devisal) for realizing a low-cost semiconductor device is desired.

A semiconductor device according to one embodiment includes: a first semiconductor chip having a first power transistor and a temperature sensing diode; and a second semiconductor chip having a second power transistor, but not having a temperature sensing diode.

A method of manufacturing a semiconductor device according to one embodiment includes: a step of mounting a first semiconductor chip having a first power transistor and temperature sensing diode on a first chip mounting portion, and a step of mounting a second semiconductor chip having a second power transistor, but not having a temperature sensing diode, on a second chip mounting portion.

A method of providing a chipset according to one embodiment includes: a step of providing a first semiconductor chip having a first power transistor and a temperature sensing diode, and a step of providing a second semiconductor chip having a second power transistor, but not having a temperature sensing diode. Here, in the first semiconductor chip, a first pad is exposed in a first opening portion of a protective film, and a second pad is exposed in a second opening portion of the protective film. On the other hand, in the second semiconductor chip, each of a first pad and a second pad is covered with a protective film so as not to be exposed from the protective film.

According to one embodiment, the manufacturing cost of the semiconductor device can be reduced.

DETAILED DESCRIPTION

Figure 1A:
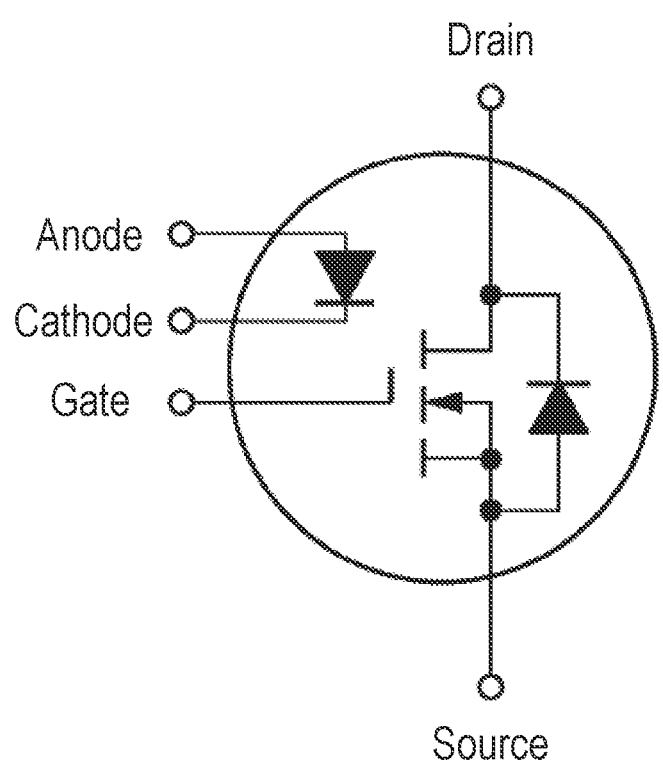
FIG. 1A is a circuit symbol schematically showing each of a first power transistor and a temperature sensing diode.

Description of Forms, Basic Terms and Usage in this Application

In all the drawings for explaining the embodiments, the same members are denoted by the same reference numerals in principle, and repetitive descriptions thereof are omitted. Note that even plan view may be hatched for the sake of clarity.

The technical idea in the present embodiment is a technical idea related to a semiconductor device including a power transistor. In the present embodiment, a power transistor is assumed to be a power MOSFET (Metal Oxide Semiconductor Field Effect Transistor), but the technical idea in the present embodiment is not limited to this, and may be applied to a mode in which a power transistor is configured as a IGBT (Insulated Gate Bipolar Transistor).

<Configuration of General Half-Bridge Circuit>

For example, as a motor driving circuit for driving the motor, there is a half-bridge circuit. A general half-bridge circuit includes a DC power supply, a high-side transistor, and a low-side transistor. Specifically, a high-side transistor and a low-side transistor are coupled in series with a DC power supply, and a motor is coupled in parallel with the low-side transistor. When the high-side transistor is turned on and the low-side transistor is turned off, a current flows from the power supply potential (positive potential) of the DC power supply to the reference potential (0V) of the DC power supply via the high-side transistor and the motor. Thus, the motor can be rotated.

On the other hand, when the high-side transistor is turned off and the low-side transistor is turned on from this state, the high-side transistor is turned off, so that no current is supplied to the motor. At this time, back electromotive force is generated in the motor due to the parasitic inductance included in the motor, but since the low-side transistor is on, a regenerative current based on back electromotive force flows in a loop composed of the low-side transistor and the motor which are connected in parallel to each other. As a result, a regenerative brake is generated in the motor, and the motor stops immediately without idling. When both the high-side transistor and the low-side transistor are turned off from a state in which the high-side transistor is turned on and the low-side transistor is turned off and a current is supplied to the motor, the motor idles and stops.

As described above, the general half bridge circuit is configured.

Here, for example, the low-side transistor is composed of a first power transistor formed in the first semiconductor chip. The high-side transistor is composed of a second power transistor formed in a second semiconductor chip different from the first semiconductor chip.

At this time, when the power transistor is operated, the semiconductor chip generates heat. As a result, the temperature of the semiconductor chip becomes high, and the power transistor may be destroyed. For this reason, a temperature sensing diode for detecting the temperature of the semiconductor chip is formed in the semiconductor chip together with the power transistor. Thus, the temperature of the semiconductor chip can be detected by the temperature sensing diode. Therefore, the operation of the power transistor can be stopped before the temperature of the semiconductor chip rises to the temperature at which the power transistor is destroyed based on the temperature detected by the temperature sensing diode. That is, by incorporating a temperature sensing diode in the semiconductor chip on which the power transistor is formed, it is possible to protect the semiconductor device comprised of the semiconductor chip having the power transistor.

Therefore, for example, in a semiconductor device, which is a component (element) of a general half-bridge circuit, a temperature sensing diode is formed in the first semiconductor chip together with the first power transistor, and a temperature sensing diode is formed in the second semiconductor chip together with the second power transistor. However, if the temperature sensing diode is incorporated in both of the first semiconductor chip and the second semiconductor chip included in semiconductor device, the manufacturing cost of semiconductor device increases.

Therefore, the present embodiment is devised to reduce the manufacturing cost of semiconductor device. In the following, the technical idea of the present embodiment with this contrivance will be described.

BASIC IDEA IN EMBODIMENT

The basic idea in the present embodiment is that a semiconductor device includes a first semiconductor chip having a first power transistor and a temperature sensing diode, and a second semiconductor chip having a second power transistor but not having a temperature sensing diode. That is, the basic idea is that, in a semiconductor device including the first semiconductor chip and the second semiconductor chip, the temperature sensing diode is not provided in both the first semiconductor chip and the second semiconductor chip, but the temperature sensing diode is provided only in one of the first semiconductor chip and the second semiconductor chip. In other words, the basic idea is that, in a semiconductor device including a plurality of semiconductor chips each having a power transistor, a temperature sensing diode is incorporated in only one semiconductor chip. According to this basic idea, it is unnecessary to provide a temperature sensing diode in all of the plurality of semiconductor chips each having the power transistor composing a semiconductor device, and thus, a manufacturing cost of the semiconductor device can be reduced.

For example, if a semiconductor device including a first semiconductor chip having a first power transistor and a temperature sensing diode, and a second semiconductor chip having the second power transistor but not having a temperature sensing diode is a component (element) of a half-bridge circuit, the first power transistor is one of a high-side transistor and a low-side transistor composing the half-bridge circuit, and the second power transistor is the other one of the high-side transistor and the low-side transistor composing the half-bridge circuit. That is, the first semiconductor chip incorporating the temperature sensing diode may be the low-side transistor or the high-side transistor.

According to this basic idea, since the temperature sensing diode is provided only in one of the plurality of semiconductor chips, the manufacturing cost of the semiconductor device, which is a component (element) of the half-bridge circuit, can be reduced as compared with a configuration in which a temperature sensing diode is incorporated in all of the plurality of semiconductor chips.

<Improvement of Half-Bridge Circuit>

In the general half-bridge circuit, each of the low-side transistor and the high-side transistor is comprised of one semiconductor chip.

In this regard, for example, a configuration in which the low-side transistor is comprised of a plurality of semiconductor chips rather than a single semiconductor chip, and in which the plurality of semiconductor chips (that is, a plurality of power transistors respectively formed on the plurality of semiconductor chips) is coupled in parallel with each other can disperse a heat generated by operating the low-side transistor. Similarly, since the high-side transistor is comprised of a plurality of semiconductor chips, a heat generated by operating the high-side transistor can be dispersed. As a consequence, a breakdown of each power transistor can be suppressed, and thus, the reliability of the semiconductor device can be improved.

<Application of Basic Idea to Improved Half-Bridge Circuit>

The basic idea can also be applied to the improved half-bridge circuit. That is, on the premise that each of the low-side transistor and the high-side transistor is configured by parallel connection of a plurality of semiconductor chips (that is, a plurality of power transistors respectively formed on a plurality of semiconductor chips), the temperature sensing diode is not provided in all of the plurality of semiconductor chips, but only in one semiconductor chip of the plurality of semiconductor chips.

This eliminates the need to provide the temperature sensing diode in all of the plurality of semiconductor-chips constituting semiconductor device, thereby reducing the manufacturing cost of semiconductor device.

For example, as an improved half-bridge circuit, consider an example in which the low-side transistor is configured by the parallel connection of the first power transistor Q1 and the third power transistor Q3, and the high-side transistor is configured by the parallel connection of the second power transistor Q2 and the fourth power transistor Q4, and the basic idea is applied to this example.

Here, a semiconductor chip on which the first power transistor Q1 is formed is a first semiconductor chip, a semiconductor chip on which the second power transistor Q2 is formed is a second semiconductor chip, a semiconductor chip on which the third power transistor Q3 is formed is a third semiconductor chip, and a semiconductor chip on which the fourth power transistor Q4 is formed is a fourth semiconductor chip.

In this case, when the basic idea is applied, the temperature sensing diode is built in only one of the first semiconductor chip, the second semiconductor chip, the third semiconductor chip, and the fourth semiconductor chip, while the temperature sensing diode is not formed in the other three semiconductor chips. For example, it is assumed that a temperature sensing diode is provided in the first semiconductor chip, while a temperature sensing diode is not provided in each of the second semiconductor chip, the third semiconductor chip, and the fourth semiconductor chip.

FIG. 1A is a circuit symbol schematically showing a first power transistor Q1. In FIG. 1A, not only the circuit symbol indicating the first power transistor but also a circuit symbol of a temperature sensing diode provided in a first semiconductor chip together with the first power transistor are illustrated.

Here, for example, the first power transistor Q1 is composed of a power MOSFET. Here, the first power transistor Q1 includes a body diode which is parasitically present in the device structure and has a gate, a source and a drain. Further, a temperature sensing diode is formed in the first semiconductor chip on which the first power transistor Q1 is formed, and the temperature sensing diode has an anode and a cathode.

Figure 1B:
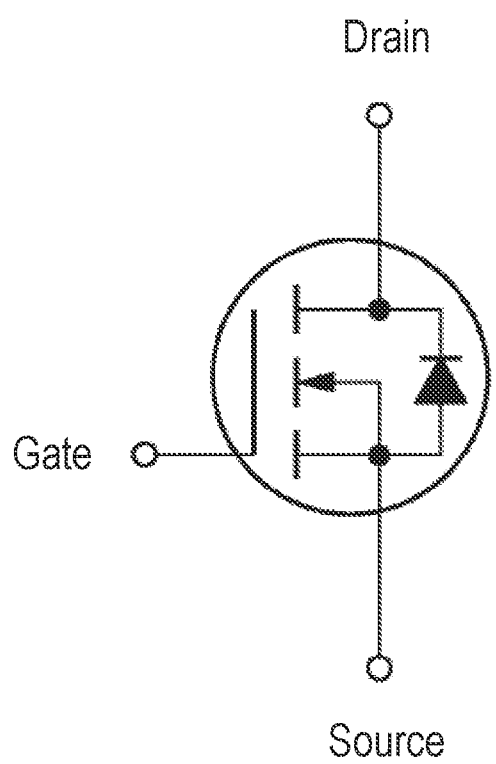
FIG. 1B is a circuit symbol schematically showing each of a second power transistor, a third power transistor and a fourth power transistor.

On the other hand, FIG. 1B is a circuit symbol schematically showing each of the second power transistor Q2, the third power transistor Q3 and the fourth power transistor Q4. As shown in FIG. 1B, since a temperature sensing diode is not mounted (formed) together with these power transistors, the circuit symbol of the temperature sensing diode is not shown.

For example, each of the second power transistor Q2, the third power transistor Q3 and the fourth power transistor Q4 includes a power MOSFET. In this case, each power transistor has a gate, a source and a drain, and includes a parasitically existing body diode in the device structure.

Figure 2:
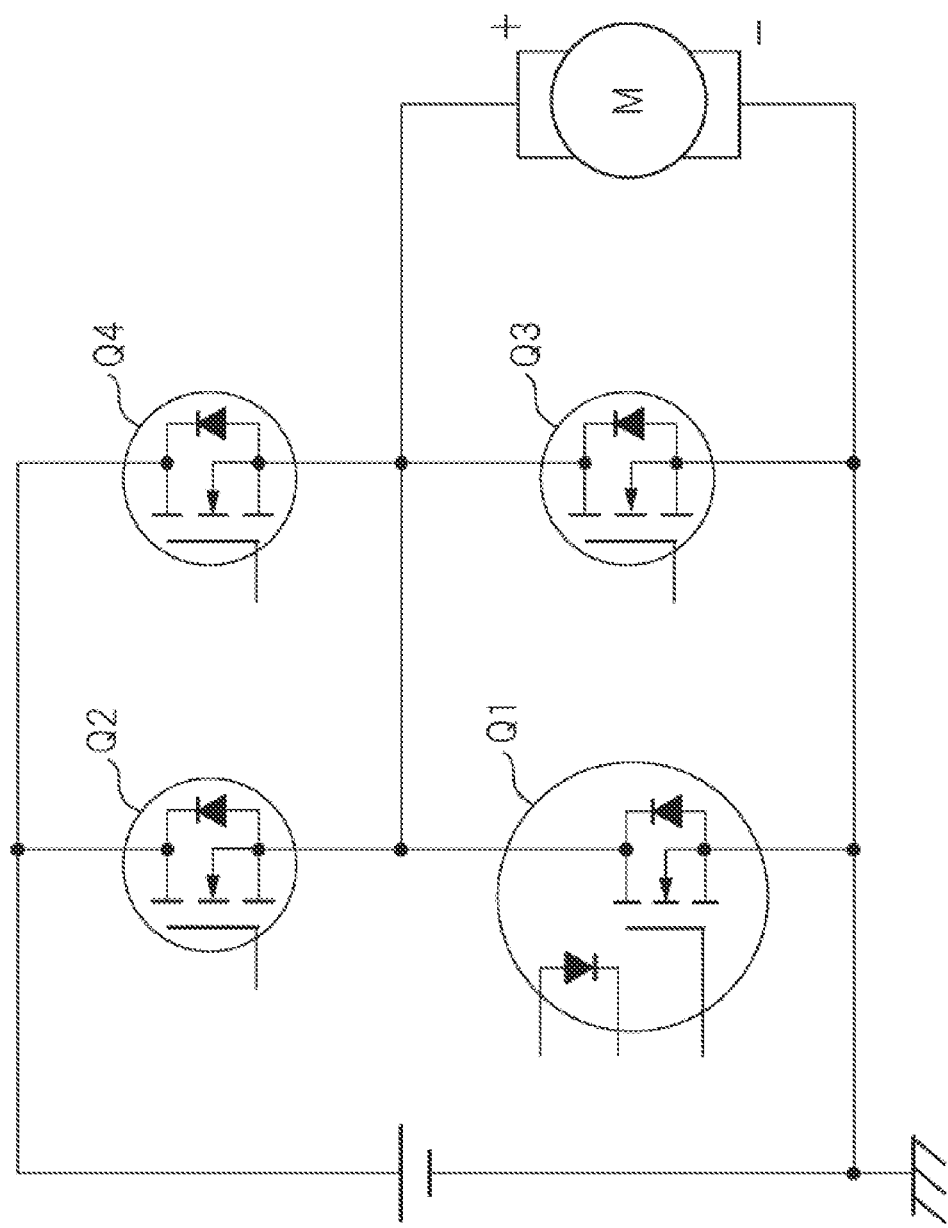
FIG. 2 is a diagram showing a configuration in which a basic idea is applied to an improved half-bridge circuit.

Using the circuit symbols shown in FIG. 1A and FIG. 1B described above, a configuration in which the basic idea is applied to an improved half-bridge circuit is illustrated as shown in FIG. 2.

FIG. 2 is a diagram showing a configuration in which a basic idea is applied to the improved half-bridge circuit.

In FIG. 2, in the improved half-bridge circuit, the low-side transistor consists of a parallel connection of a first power transistor Q1 and a third power transistor Q3, while the high-side transistor consists of a parallel connection of a second power transistor Q2 and a fourth power transistor Q4. Since the low-side transistor and the high-side transistor are connected in series, the first power transistor Q1 and the second power transistor Q2 are connected in series, and the third power transistor Q3 and the fourth power transistor Q4 are also connected in series.

As described above, by applying the basic idea to the improved half bridge circuit, the on-resistance can be reduced by improving the half bridge, and the manufacturing cost of semiconductor device can be reduced by the basic idea. That is, according to semiconductor device having the configuration shown in FIG. 2, the performance of semiconductor device can be improved, and the manufacturing cost of semiconductor device can be reduced.

In the basic idea, only one semiconductor chip of the plurality of semiconductor chips is provided with a temperature sensing diode. In this case, a position where the semiconductor chip having the temperature sensing diode is mounted is important. This is because if the semiconductor chip having the temperature sensing diode is not arranged at an appropriate position, the overheat condition of the semiconductor device cannot be grasped appropriately. For example, if the semiconductor chip having the temperature sensing diode can be arranged at the hot spot where the temperature is the highest, the overheat condition of the semiconductor device can be grasped appropriately. In other words, when the semiconductor chip having the temperature sensing diode is not arranged at the hot spot, the semiconductor chip having no temperature sensing diode is arranged at the hot spot. As a result, even when the semiconductor chip has reached the overheat state, it is difficult to appropriately detect the above-described overheat condition by a temperature sensing diode of the semiconductor chip having the temperature sensing diode arranged at a position other than the hot spot. Therefore, in realizing the basic idea, it is desirable to appropriately design a position where the semiconductor chip having the temperature sensing diode is mounted. In the following, embodiments embodying the basic idea will be described with reference to the drawings.

Embodiments

<<Mounting Configuration of Semiconductor Device>>

Figure 3:
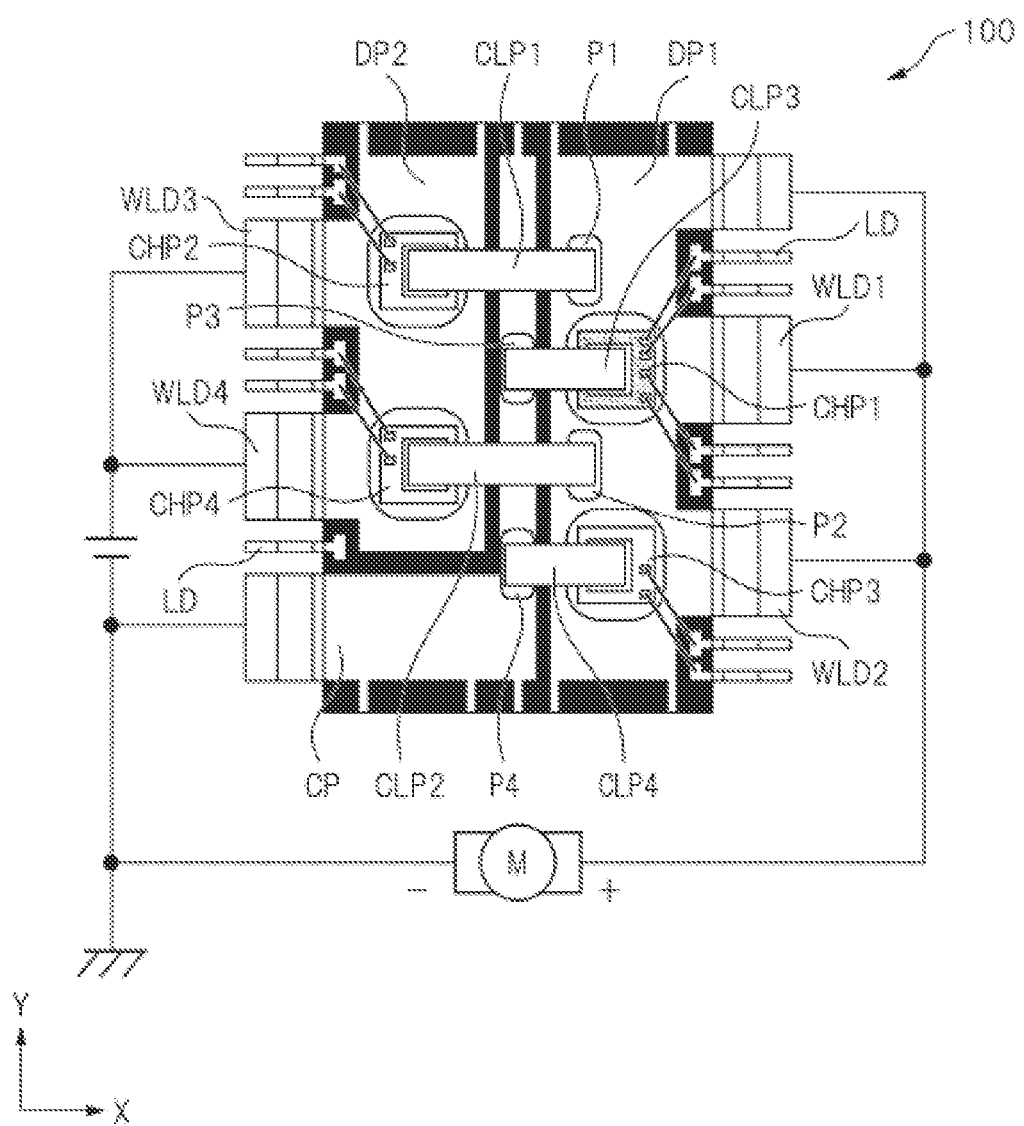
FIG. 3 is a view showing a mounting configuration of a semiconductor device embodying the improved half-bridge circuit shown in FIG. 2.

FIG. 3 is a view showing a mounting configuration of a semiconductor device 100 embodying the improved half-bridge circuit shown in FIG. 2.

In FIG. 3, the semiconductor device 100 includes a chip mounting portion DP1 and a chip mounting portion DP2. The chip mounting portion DP1 and the chip mounting portion DP2 are arranged so as to be aligned in the X direction (second direction). That is, the chip mounting portion DP2 is disposed adjacent to the chip mounting portion DP1 so as to be separated from the chip mounting portion DP1 in a plan view. Each of the chip mounting portion DP1 and the chip mounting portion DP2 extends in the Y direction (first direction) intersecting the X direction.

Next, a low-side transistor r including the first power transistor Q1 and the third power transistor Q3 shown in FIG. 2 connected in parallel is mounted on the chip-mounting portion DP1. Specifically, a first semiconductor chip CHP1 in which the first power transistor Q1 and the temperature sensing diode are formed and a third semiconductor chip CHP3 in which the third power transistor Q3 is formed and the temperature sensing diode is not formed are mounted on the chip mounting portion DP1. In particular, as shown in FIG. 3, the first semiconductor chip CHP1 and the third semiconductor chip CHP3 are arranged so as to be spaced apart from each other in the Y-direction in a plan view. For example, each of the first semiconductor chip CHP1 and the third semiconductor chip CHP3 is mounted on the chip mounting portion DP1 via a conductive adhesive represented by solder or silver paste.

A high-side transistor including a second power transistor Q2 and a fourth power transistor Q4 connected in parallel as shown in FIG. 2 is mounted on the chip-mounting portion DP2. Specifically, on the chip mounting portion DP2, the second power transistor Q1 is formed, while the second semiconductor chip CHP2 in which the temperature sensing diode is not formed and the fourth semiconductor chip CHP4 in which the temperature sensing diode is not formed while the fourth power transistor Q3 is formed are mounted. In particular, as shown in FIG. 3, the second semiconductor chip CHP2 and the fourth semiconductor chip CHP4 are arranged so as to be spaced apart from each other in the Y-direction in a plan view. For example, each of the second semiconductor chip CHP2 and the fourth semiconductor chip CHP4 is mounted on the chip mounting portion DP2 via a conductive adhesive.

Subsequently, as shown in FIG. 3, the second semiconductor chip CHP2 is electrically connected to the chip mounting portion DP1 via a clip CLP1 which is a plate-shaped member. For example, the clipping CLP1 is connected to first portion P1 of the chip-mounting portion DP1 via a conductive adhesive.

Similarly, the fourth semiconductor chip CHP4 is electrically connected to the chip mounting portion DP1 via a clip CLP2 which is a plate-shaped member. For example, the clipping CLP2 is connected to second portion P2 of the chip-mounting portion DP1 via a conductive adhesive.

Here, the first semiconductor chip CHP1 is disposed in a plan view between the chip mounting portion DP1 to which the clip CLP1 is connected, first portion P1, and the chip mounting portion DP1 to which the clip CLP2 is connected, second portion P2. On the other hand, the third semiconductor chip CHP3 is arranged such that, in a plan view, the chip mounting portion DP1 has a second portion P2 located between the first semiconductor chip CHP1 and the third semiconductor chip CHP3.

Next, in FIG. 3, the semiconductor device 100 further includes a conductive patterned portion CP disposed between the chip mounting portion DP1 and the chip mounting portion DP2 in a plan view. The conductive patterned portion CP has a first extending portion extending in the Y direction and a second extending portion extending in the X direction, and has, for example, an inverted L-shaped planar shape.

As shown in FIG. 3, the first semiconductor chip CHP1 is electrically connected to the conductive patterned portion CP via a clip CLP3 which is a plate-shaped member. For example, the clipping CLP3 is connected to third portion P3 of the conductive patterned portion CP via a conductive adhesive.

Similarly, the third semiconductor chip CHP3 is electrically connected to the conductive patterned portion CP via a clip CLP4 which is a plate-shaped member. For example, the clipping CLP4 is connected to fourth portion P4 of the conductive patterned portion CP via a conductive adhesive.

Here, the clip CLP1 extends over the second semiconductor chip CHP2 and the chip mounting portion DP1 so as not to physically touch the conductive patterned portion CP. The clip CLP2 extends over the fourth semiconductor chip CHP4 and the chip mounting portion DP1 so as not to physically touch the conductive patterned portion CP.

As shown in FIG. 3, the clip CLP3 is disposed between the clip CLP1 and the clip CLP2 in a plan view. The clip CLP2 is disposed between the clip CLP3 and the clip CLP4 in a plan view.

Subsequently, in FIG. 3, the semiconductor device 100 further includes a wide lead WLD1 and a wide lead WLD2 integrally formed with the chip mounting portion DP1, a wide lead WLD3 and a wide lead WLD4 integrally formed with the chip mounting portion DP2, and a plurality of lead LD arranged so as to be separated from each of the chip mounting portion DP1 and the chip mounting portion DP2. At this time, the wide lead WLD1 is disposed next to the first semiconductor chip CHP1 in the X direction, while the wide lead WLD2 is disposed next to the third semiconductor chip CHP3 in the X direction. The wide lead WLD3 is disposed next to the second semiconductor chip CHP2 in the X direction, while the wide lead WLD4 is disposed next to the fourth semiconductor chip CHP4 in the X direction.

Here, as shown in FIG. 3, the breadth of each of the broad lead WLD1, wide lead WLD2, wide lead WLD3 and wide lead WLD4 (the breadth in the Y-direction) is greater than the breadth of each of the multiple leads (the breadth in the Y-direction).

As described above, the semiconductor device 100 according to the embodiment is implemented.

Features in Embodiment

Next, feature points according to an embodiment will be described.

A first feature of the embodiment is that the semiconductor chip provided with both the power transistor and the temperature sensing diode is arranged at a place where the heat generation amount of semiconductor device is large, on the premise that the temperature sensing diode is provided only in one semiconductor chip of the plurality of semiconductor chips provided with the power transistor. In other words, a feature point is that a semiconductor chip in which a temperature sensing diode is provided at a position where the temperature is most likely to be the highest temperature among the positions where a plurality of semiconductor chips is mounted is arranged.

Thus, according to the feature point, even when the temperature sensing diode is provided only in one semiconductor chip of the plurality of semiconductor chips, the overheat condition of semiconductor device can be appropriately grasped by disposing the semiconductor chip provided with the temperature sensing diode at the hot spot at which the temperature is highest. As a result, it is possible to suppress breakage of the power transistor due to high temperature of the semiconductor chip. That is, the operation of the power transistor can be stopped before the temperature of the semiconductor chip rises to the temperature at which the power transistor is destroyed based on the temperature detected by the temperature sensing diode. Therefore, according to the characteristic point, it is possible to improve the reliability of semiconductor device while reducing the manufacturing cost of semiconductor device by adopting the basic idea.

As described above, the feature point is that the semiconductor chip including the temperature sensing diode is arranged at the hot spot at which the temperature is highest. Specifically, the portion where the temperature is most likely to increase among the portions where the plurality of semiconductor chips is mounted is an area where the first semiconductor chip CHP1 is mounted in FIG. 3. That is, as shown in FIG. 3, in a plan view, the first semiconductor chip CHP1 is disposed between first portion P1 of the chip mounting portion DP1 to which the clip CLP1 is connected and second portion P2 of the chip mounting portion DP1 to which the clip CLP2 is connected. In the following, the semiconductor device 100 having the mounting configuration illustrated in FIG. 3 will be described as a high-temperature spot in which the above-described regions are most likely to become hot.

Figure 4:
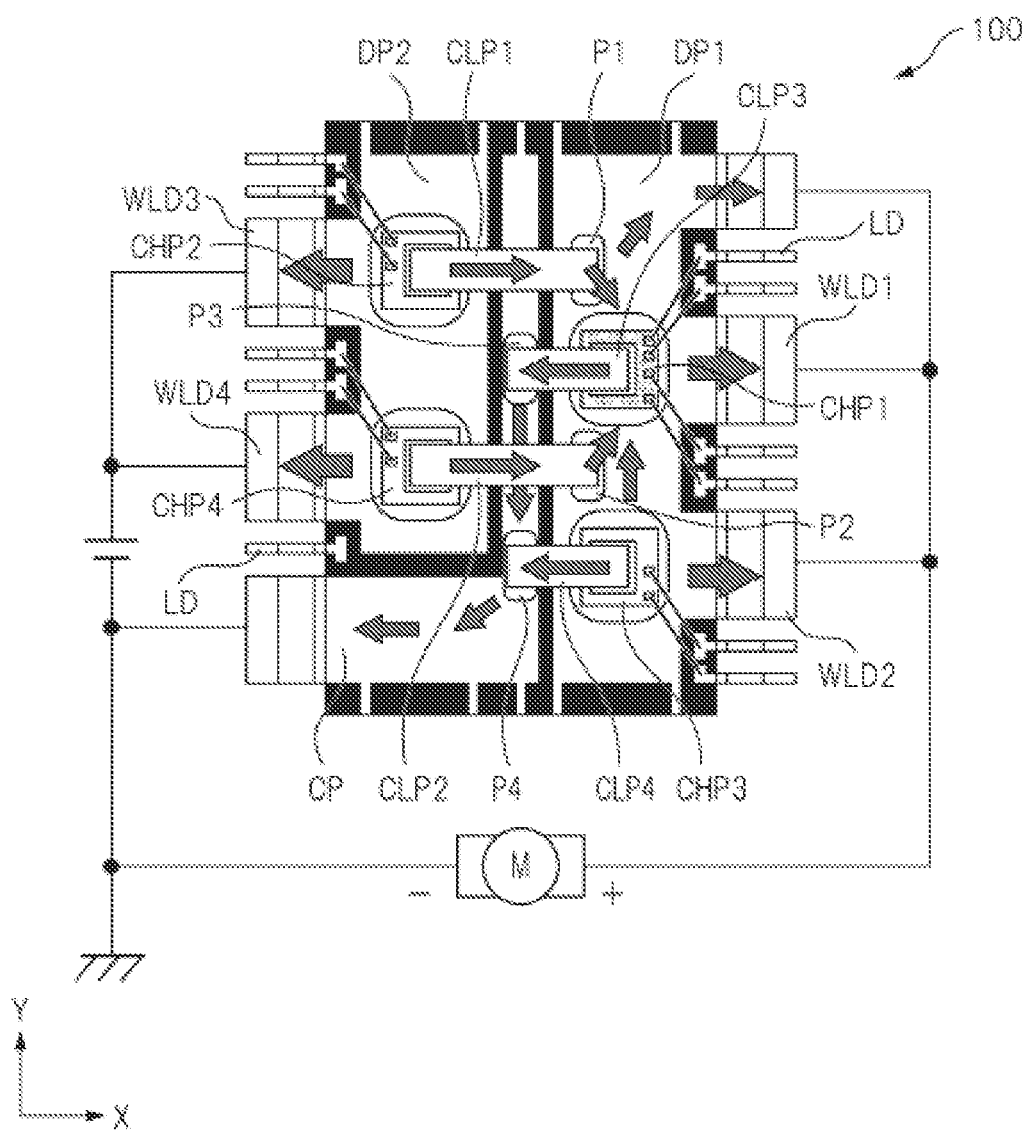
FIG. 4 is a view schematically showing a flow of a heat generated by operating the power transistor provided in each of a plurality of semiconductor chips.

FIG. 4 is, for example, a view schematically showing a flow of a heat generated by operating a power transistor provided in each of a plurality of semiconductor chips. In FIG. 4, an arrow indicates a current of heat, and a thicker arrow indicates a larger flow of heat. In view of this, FIG. 4 shows that the ends of the arrows are concentrated in the regions where the first semiconductor chip CHP1 is mounted.

For example, an arrow indicating that heat generated in the second semiconductor chip CHP2 flows through the clip CLP1, an arrow indicating that heat generated in the fourth semiconductor chip CHP4 flows through the clip CLP2, and an arrow indicating that heat generated in the third semiconductor chip CHP3 is transmitted through the chip mounting portion DP1 are concentrated in an area where the first semiconductor chip CHP1 is mounted. This means that, in view of the fact that the first semiconductor chip CHP1 itself also generates heat, the heat is likely to collect in the region where the semiconductor chip CHP1 is mounted, and thereby the first semiconductor chip CHP1 is likely to become a high temperature.

Therefore, in the embodiment, the temperature sensing diode is mounted on the first semiconductor chip CHP1 mounted in the region between first portion P1 and second portion P2. That is, as shown in FIG. 4, the region between first portion P1 and second portion P2 is the hotspot having the highest temperature, and the first semiconductor chip CHP1 provided with the temperature sensing diode is disposed in the hotspot. Thus, according to the embodiment, the hot spot of the semiconductor device 100 can be monitored by the temperature sensing diode. In other words, according to the embodiment, the overheat condition of the semiconductor device 100 can be appropriately grasped. As a consequence, according to the semiconductor device 100 in the embodiment, it is possible to prevent the power transistor provided in the first semiconductor-chip CHP1 disposed in the hot spot from being destroyed.

Next, as shown in FIGS. 3 and 4, a second feature point in the embodiment is that a wide lead is provided next to each of the plurality of semiconductor chips in the X direction. In other words, it can be said that the second feature point is that there is a wide lead corresponding to each of the plurality of semiconductor chips, and in the X direction, each of the plurality of semiconductor chips and the wide lead are arranged on a straight line. For example, in FIGS. 3 and 4, a wide lead WLD1 is disposed next to the first semiconductor chip CHP1, while a wide lead WLD2 is disposed next to the third semiconductor chip CHP3. Similarly, in FIGS. 3 and 4, a wide lead WLD3 is disposed next to the second semiconductor chip CHP2, while a wide lead WLD4 is disposed next to the fourth semiconductor chip CHP4.

Here, the width of the wide lead in the Y direction is larger than the width of the lead LD in the Y direction. Thus, according to the second feature, as shown in FIG. 4, the heat generated in each of the plurality of semiconductor chips can be efficiently dissipated from a wide lead having a large width in the Y direction disposed next to the semiconductor chip. Consequently, according to the embodiment, the reliability of the semiconductor device 100 can be improved.

First Modified Example

Figure 5:
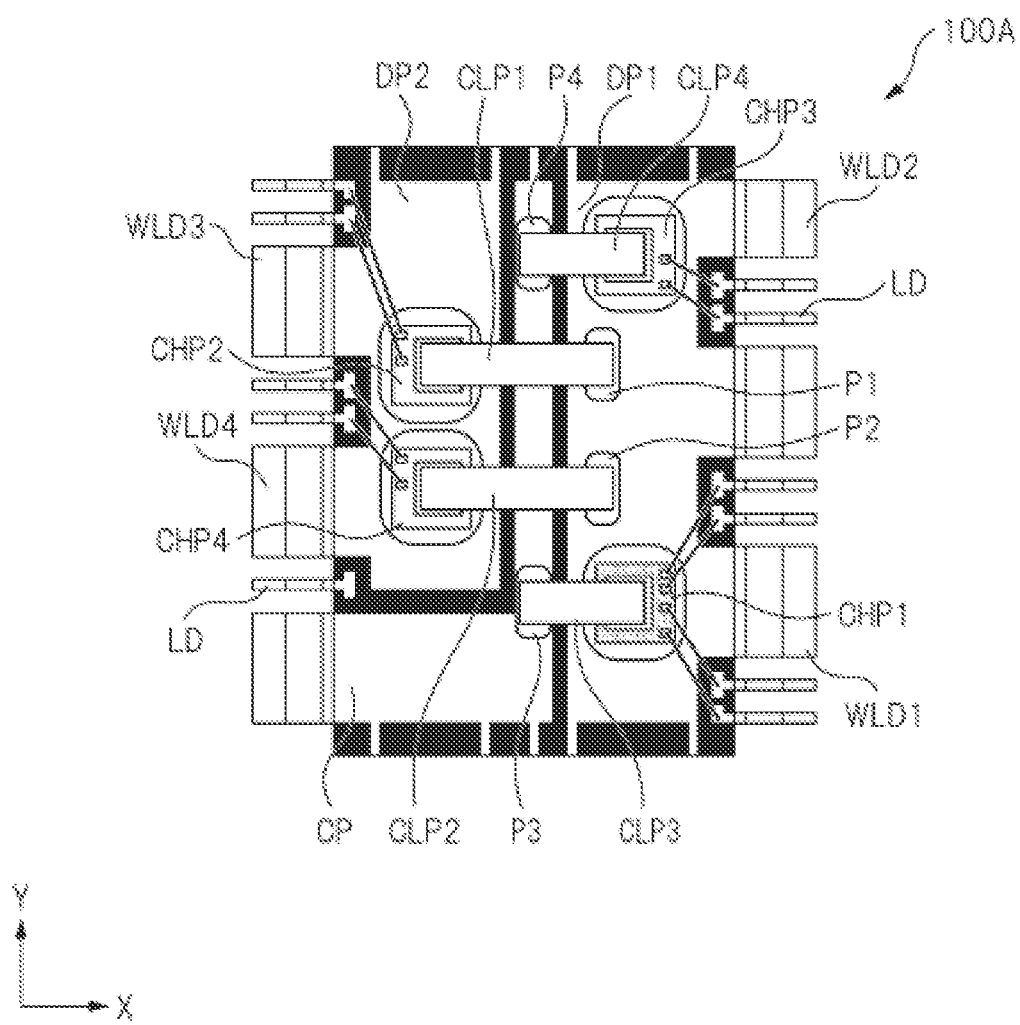
FIG. 5 is a view showing a mounting configuration of a semiconductor device according to a first modified example.

FIG. 5 is a view showing a mounting configuration of a semiconductor device 100A according to the present first modified example.

As shown in FIG. 5, in the semiconductor device 100A, the distance between the first semiconductor chip CHP1 mounted on the chip mounting portion DP1 and the third semiconductor chip CHP3 is larger than the distance between the first semiconductor chip CHP1 and the third semiconductor chip CHP3 in the embodiment shown in FIG. 3. In particular, as shown in FIG. 5, in the present first modified example, a first portion P1 for connecting the clip CLP1 and the chip mounting portion DP1 and a second portion P2 for connecting the clip CLP2 and the chip mounting portion DP1 are located between the first semiconductor chip CHP1 and the third semiconductor chip CHP3 in a plan view. At this time, the first semiconductor chip CHP1 is provided with a temperature sensing diode together with the power transistor, while the power transistor is provided in the second semiconductor chip CHP2, the third semiconductor chip CHP3, and the fourth semiconductor chip CHP4, and the temperature sensing diode is not provided.

Thus, the basic idea in the present embodiment may not only be embodied as the embodiment shown in FIG. 3, but may also be embodied as the present first modified example shown in FIG. 5, for example.

Second Modified Example

In the improved half-bridge circuit, the low-side transistor is comprised of a parallel connection of power transistors provided in each of the plurality of semiconductor chips, and the high-side transistor is comprised of a parallel connection of power transistors provided in each of the plurality of semiconductor chips. At this time, in the above-described embodiment, an example in which two semiconductor chips are used as a plurality of semiconductor chips is described. Specifically, as shown in FIG. 3, the low-side transistor includes a parallel connection of power transistors provided in each of the first semiconductor chip CHP1 and the third semiconductor chip CHP3, and the high-side transistor includes a parallel connection of power transistors provided in each of the second semiconductor chip CHP2 and the fourth semiconductor chip CHP4.

In this regard, the present modified example describes an embodiment in which three semiconductor chips are used as a plurality of semiconductor chips. For example, the low-side transistor includes a parallel connection of power transistors provided in each of the first semiconductor chip CHP1, the third semiconductor chip CHP3, and the fifth semiconductor chip CHP5, and the high-side transistor includes a parallel connection of power transistors provided in each of the second semiconductor chip CHP2, the fourth semiconductor chip CHP4, and the sixth semiconductor chip CHP6.

Figure 6:
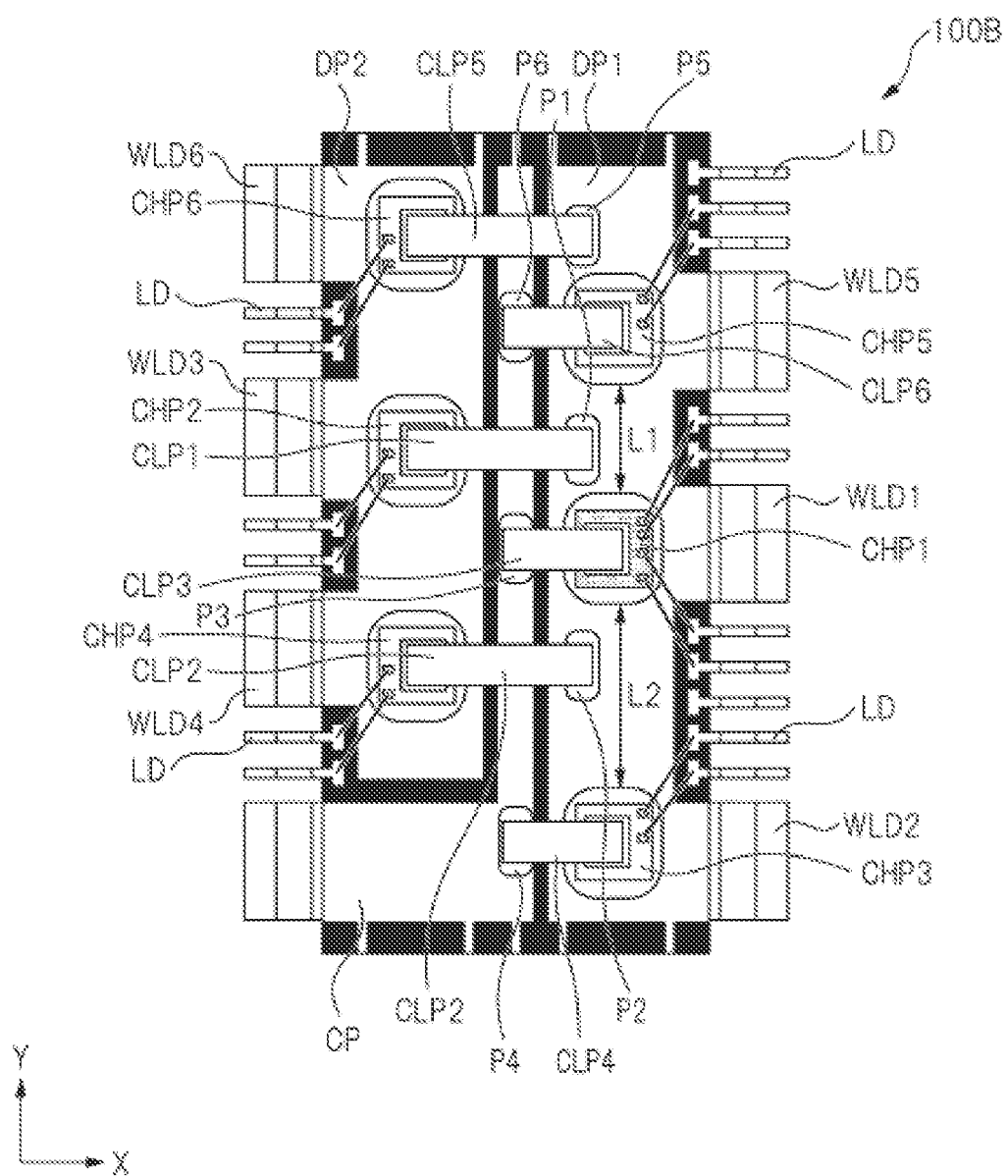
FIG. 6 is a view showing a mounting configuration of a semiconductor device according to a second modified example.

FIG. 6 is a view showing a mounting configuration of a semiconductor device 100B according to the present second modified example.

In FIG. 6, three semiconductor chips, i.e., a first semiconductor chip CHP1, a third semiconductor chip CHP3, and a fifth semiconductor chip CHP5, are mounted on the chip mounting portion DP1. On the other hand, three semiconductor chips, i.e., a second semiconductor chip CHP2, a fourth semiconductor chip CHP4, and a sixth semiconductor chip CHP6, are mounted on the chip mounting portion DP2.

As shown in FIG. 6, in a plan view, the first semiconductor chip CHP1 is provided between the clip CLP1 and the chip mounting portion DP1, first portion P1 connecting the clip CLP2 and the chip mounting portion DP1, and second portion P2 connecting the chip mounting portion.

Similarly, in a plan view, the fifth semiconductor chip CHP5 is provided between the clip CLP5 and the chip mounting portion DP1, fifth portion P5 connecting the clip CLP1 and the chip mounting portion DP1, and first portion P1 connecting the chip mounting portion DP1.

Further, as shown in FIG. 6, in a plan view, the clip CLP6 is provided between the clip CLP5 and the clip CLP1, and connects the fifth semiconductor chip CHP5 and the sixth partial P6 of the conductive patterned portion CP. Similarly, in a plan view, the clip CLP3 is provided between the clip CLP1 and the clip CLP2, and connects the first semiconductor chip CHP1 and third portion P3 of the conductive patterned portion CP.

Here, in FIG. 6, the first semiconductor chip CHP1 is provided between first portion P1 and second portion P2, and the fifth semiconductor chip CHP5 is provided between fifth portion P5 and first portion P1. Therefore, not only the first semiconductor chip CHP1 but also the fifth semiconductor chip CHP5 are arranged at hot spots where the temperature is high.

Therefore, from the viewpoint of providing the temperature sensing diode in the semiconductor chip disposed in the hot spot, for example, not only the power transistor and the temperature sensing diode may be provided in the first semiconductor chip CHP1, but also the power transistor and the temperature sensing diode may be provided in the fifth semiconductor chip CHP5. Accordingly, in the semiconductor device 100B having a plurality of hot spots, each of the plurality of hot spots can be monitored by the temperature sensing diode, so that the reliability of the semiconductor device 100B can be improved.

Further, in FIG. 6, the first semiconductor chip CHP1 is arranged not only between first portion P1 and second portion P2, but also between the fifth semiconductor chip CHP5 and the third semiconductor chip CHP3. Therefore, the first semiconductor chip CHP1 is affected by both the heat generated in the third semiconductor chip CHP3 and the heat generated in the fifth semiconductor chip CHP5. As a consequence, the temperature of the first semiconductor chip CHP1 tends to increase.

Therefore, for example, the distance L2 between the first semiconductor chip CHP1 and the third semiconductor chip CHP3 may be longer than the distance L1 between the first semiconductor chip CHP1 and the fifth semiconductor chip CHP5. In this manner, since the effect due to the heat from the third semiconductor chip CHP3 can be reduced, the increasement of the temperature of the first semiconductor chip CHP1 can be relieved. Therefore, the reliability of the semiconductor device 100B can be improved.

<<Method of Manufacturing Semiconductor Device in Embodiment>>

Next, a method of manufacturing a semiconductor device according to an embodiment will be described.

Figure 7:
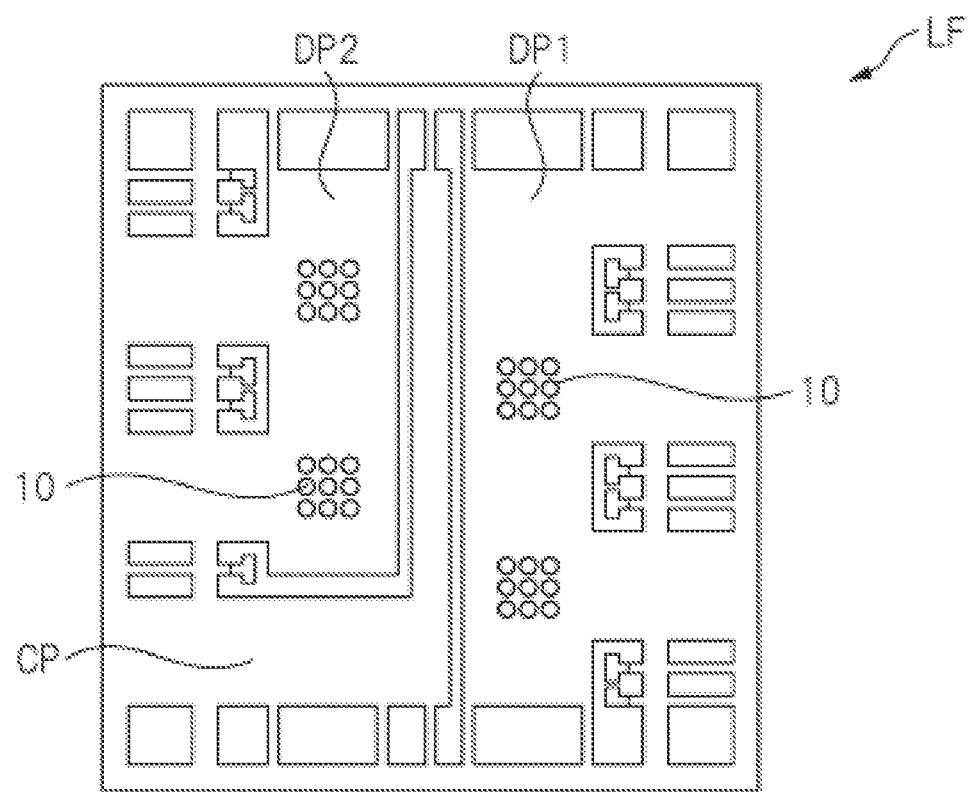
FIG. 7 is a view showing a manufacturing process of a semiconductor device according to an embodiment.

First, as shown in FIG. 7, a lead frame LF having a chip mounting portion DP1, a chip mounting portion DP2, and a conductive patterned portion CP is prepared. Then, a conductive adhesive material 10 made of, for example, solder or silver paste is applied to a partial region of the chip mounting portion DP1 and a partial region of the chip mounting portion DP2. Further, a first semiconductor chip CHP1 including transistor and a temperature sensing diode, a second semiconductor chip CHP2 including a power transistor but not including a temperature sensing diode, a third semiconductor chip CHP3, and a fourth semiconductor chip CHP4 are prepared. That is, a chipset (i.e., set of chips) including the first semiconductor chip CHP1, the second semiconductor chip CHP2, the third semiconductor chip CHP3, and the fourth semiconductor chip CHP4 is prepared.

Figure 8:
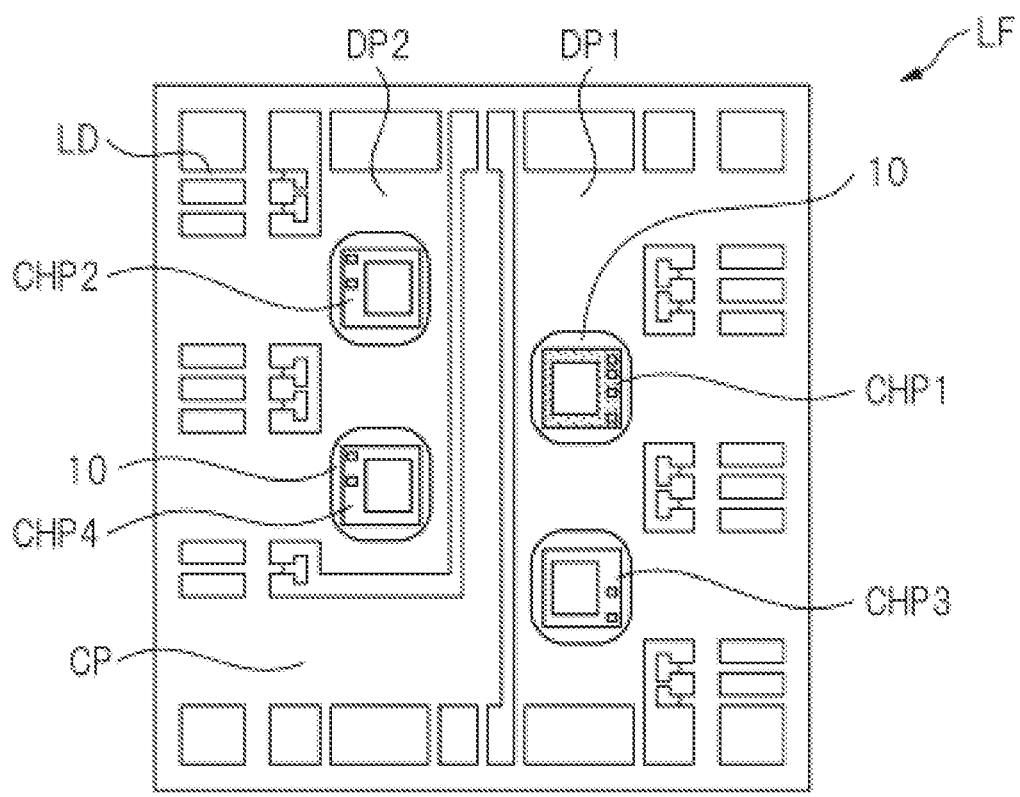
FIG. 8 is a view showing a manufacturing process of the semiconductor device following FIG. 7.

Next, as shown in FIG. 8, by using the die bonding device, the first semiconductor chip CHP1 and the third semiconductor chip CHP3 are mounted on the chip mounting portion DP1 via the conductive adhesive material 10, and the second semiconductor chip CHP2 and the fourth semiconductor chip CHP4 are mounted on the chip mounting portion DP2 via the conductive adhesive material 10.

Figure 9:
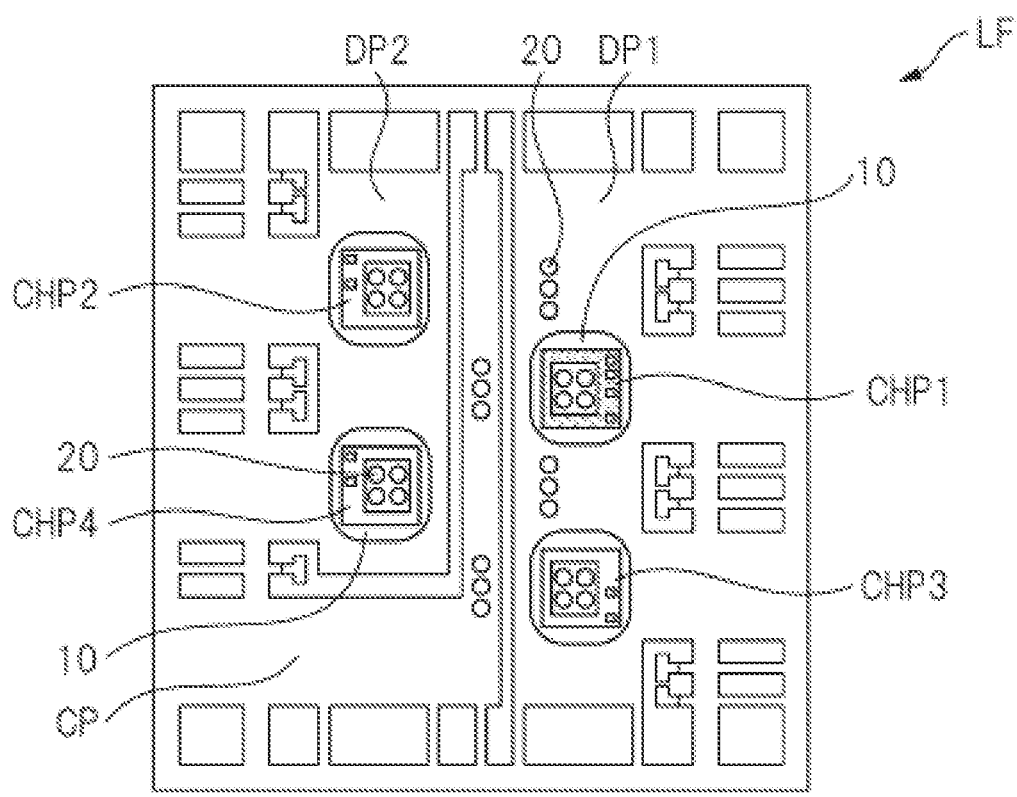
FIG. 9 is a view showing a manufacturing process of the semiconductor device following FIG. 8.

Thereafter, as shown in FIG. 9, the conductive adhesive 20 is applied on a partial region of the chip mounting portion DP1, on a partial region of the conductive patterned portion CP, on the first semiconductor chip CHP1, on the second semiconductor chip CHP2, on the third semiconductor chip CHP3, and on the fourth semiconductor chip CHP4.

Figure 10:
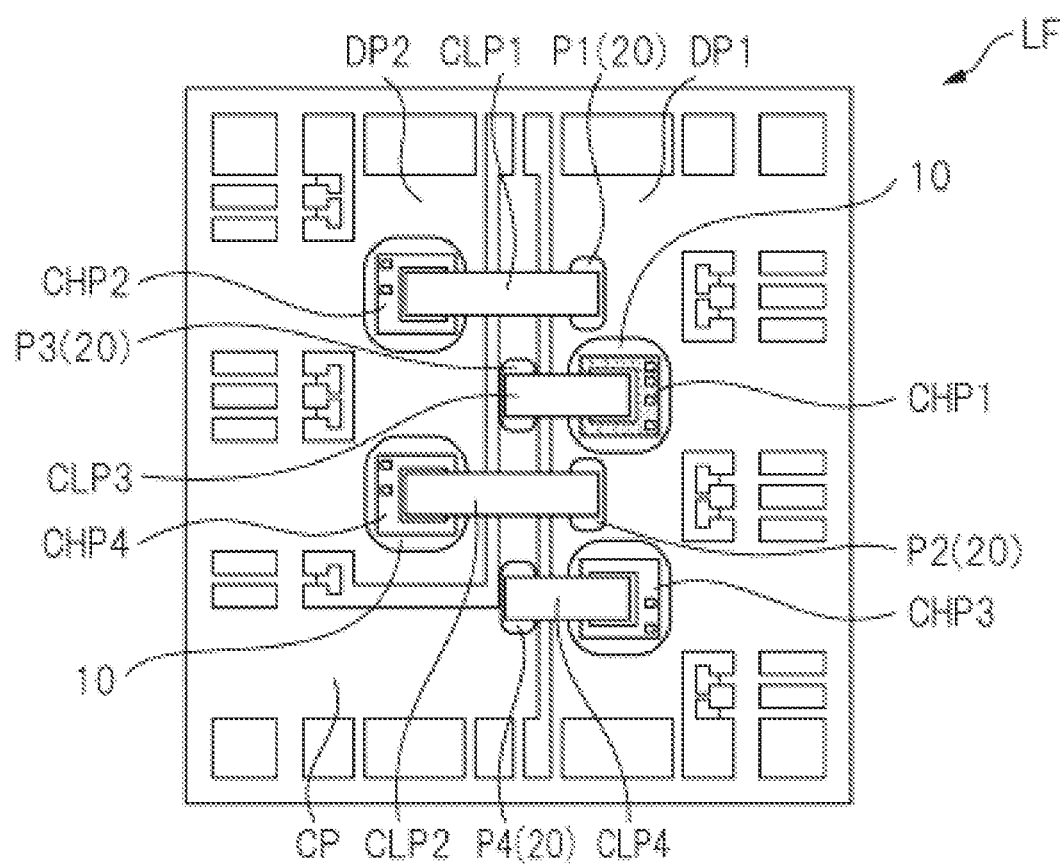
FIG. 10 is a view showing a manufacturing process of the semiconductor device following FIG. 9.

Subsequently, as shown in FIG. 10, a plurality of clips are mounted. Specifically, the second semiconductor chip CHP2 and DP1 chip mounting portion first portion P1 are connected by a clip CLP1, and the fourth semiconductor chip CHP4 and the chip mounting portion second portion P2 are connected by a clip CLP2. Further, the first semiconductor chip CHP1 and CP of the conductive patterned portion third portion P3 is connected by a clip CLP3, the third semiconductor chip CHP3 and the conductive patterned portion fourth portion P4 is connected by a clip CLP4.

Figure 11:
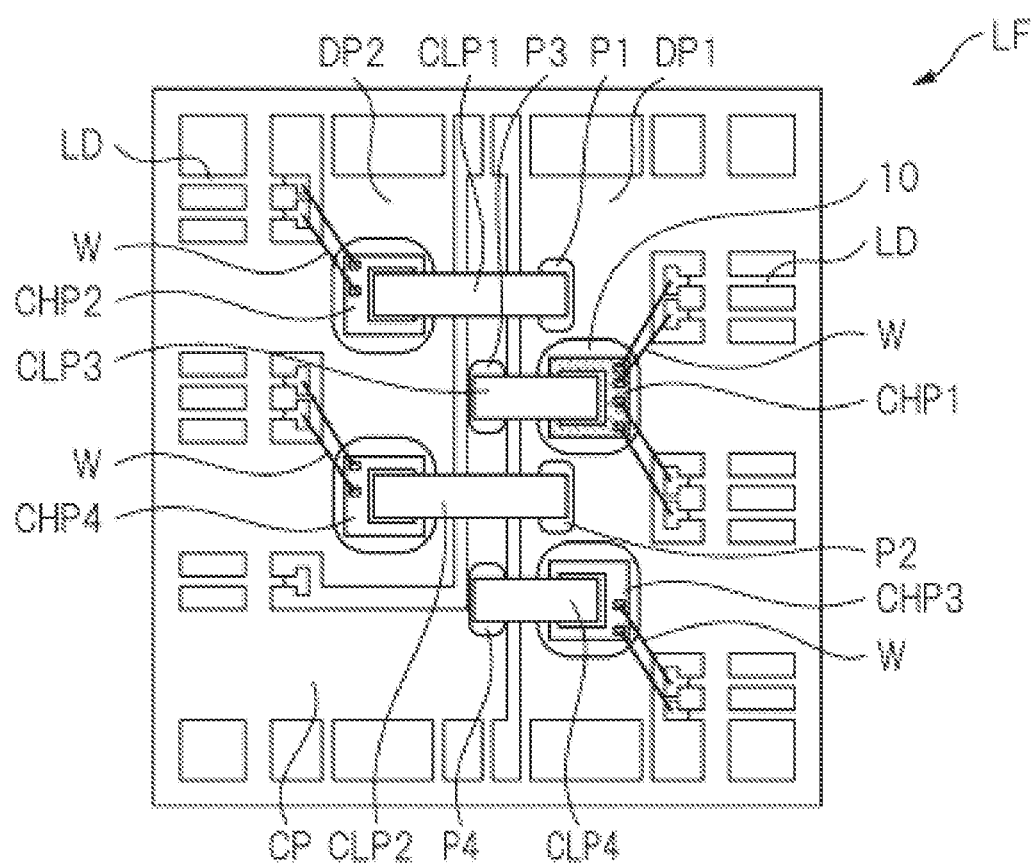
FIG. 11 is a view showing a manufacturing process of the semiconductor device following FIG. 10.

Then, as shown in FIG. 11, by using the wire bonding device, the first semiconductor chip CHP1 and the lead LD are connected by the bonding wire W, and the third semiconductor chip CHP3 and the lead LD are connected by the bonding wire. Similarly, the second semiconductor chip CHP2 and the lead LD are connected by a bonding wire W, and the fourth semiconductor chip CHP4 and the lead LD are connected by a bonding wire.

Figure 12:
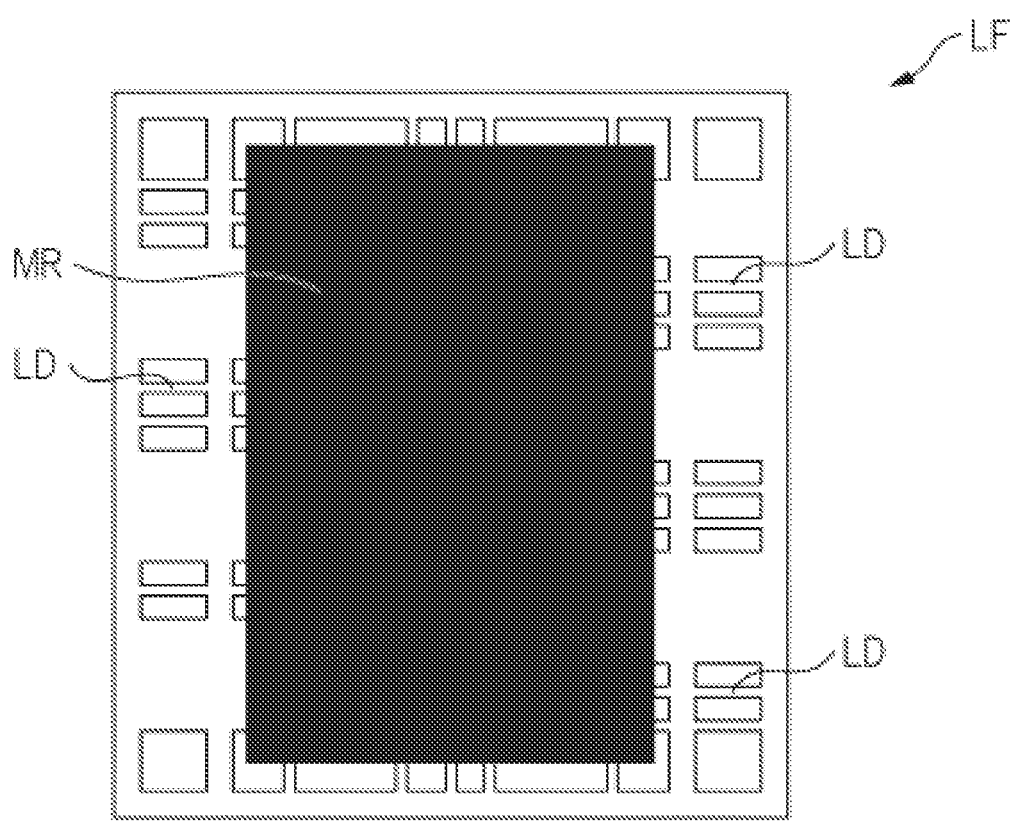
FIG. 12 is a view showing a manufacturing process of the semiconductor device following FIG. 11.

Thereafter, as shown in FIG. 12, the sealing body MR is formed by a step of resin-sealing (molding). Next, a step of deburring is performed, and a plating layer is formed on the outer lead portion, which is exposed from the sealing body MR, of the lead LD, as needed. Subsequently, after marking is formed on the surface of the sealing body MR, the sealing body MR is separated from the frame of the lead frame LF by cutting the lead LD at a predetermined position outside the sealing body MR. Then, the outer lead portion of the lead LD protruding from the sealing body MR is bent.

As described above, semiconductor device in the embodiment can be manufactured.

<<Necessity of Innovation>>

In the method of manufacturing the semiconductor device described above, a semiconductor chip (hereinafter, sometimes referred to as a "built-in chip") having a power transistor and a temperature sensing diode and a semiconductor chip having a power transistor but not having a temperature sensing diode (hereinafter, sometimes referred to as a "non-built-in chip") are used. The built-in chip and the non-built-in chip are provided as a chipset (i.e., set of chips), for example, from a device manufacturer to an manufacturer, the assembly and assembly manufacturer manufactures a semiconductor device by using the provided chipset. At this time, the chipset includes the built-in chip and the non-built-in chip. Also, if the built-in chip and the non-built-in chip cannot be distinguished from each other in appearance, then a normal semiconductor device cannot be manufactured. Therefore, in order to realize the basic idea, it is necessary to distinguish the built-in chip from the non-built-in chip in appearance. That is, an innovation (devisal, contrivance) for distinguishing the built-in chip from the non-built-in chip in appearance is desired.

This point of the innovation will be described below.

<<Innovation for Distinguishing in Appearance>

Figure 13A:
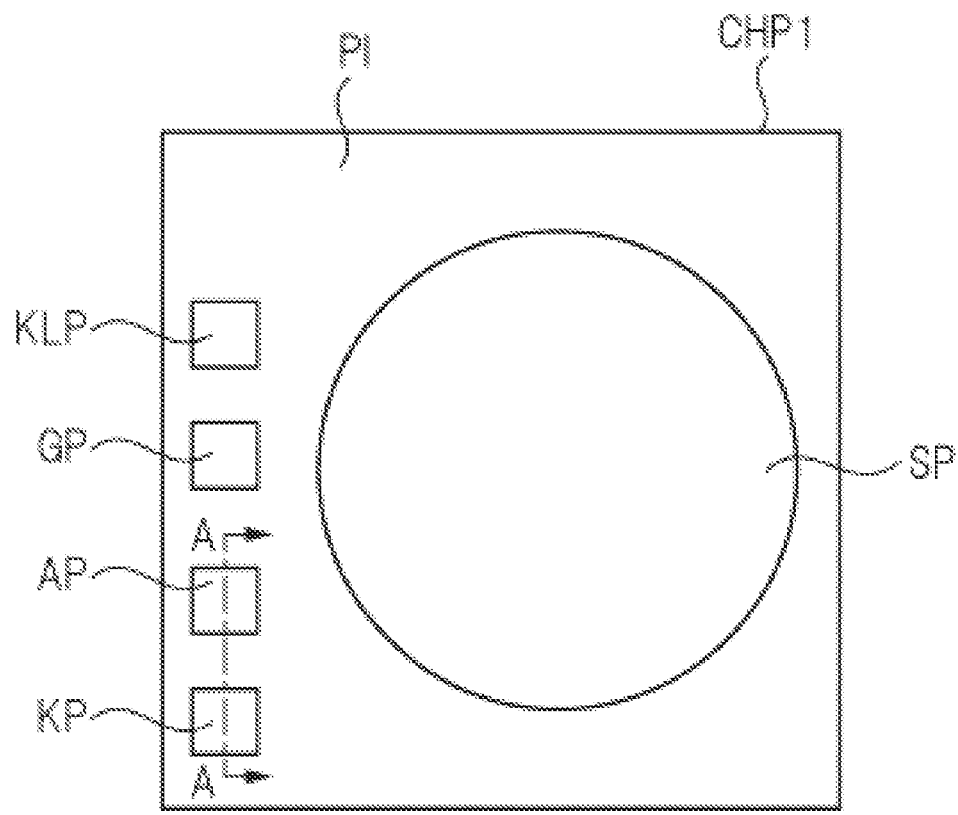
FIG. 13A is a view showing a planar layout of a first semiconductor chip that is a built-in chip.
Figure 13B:
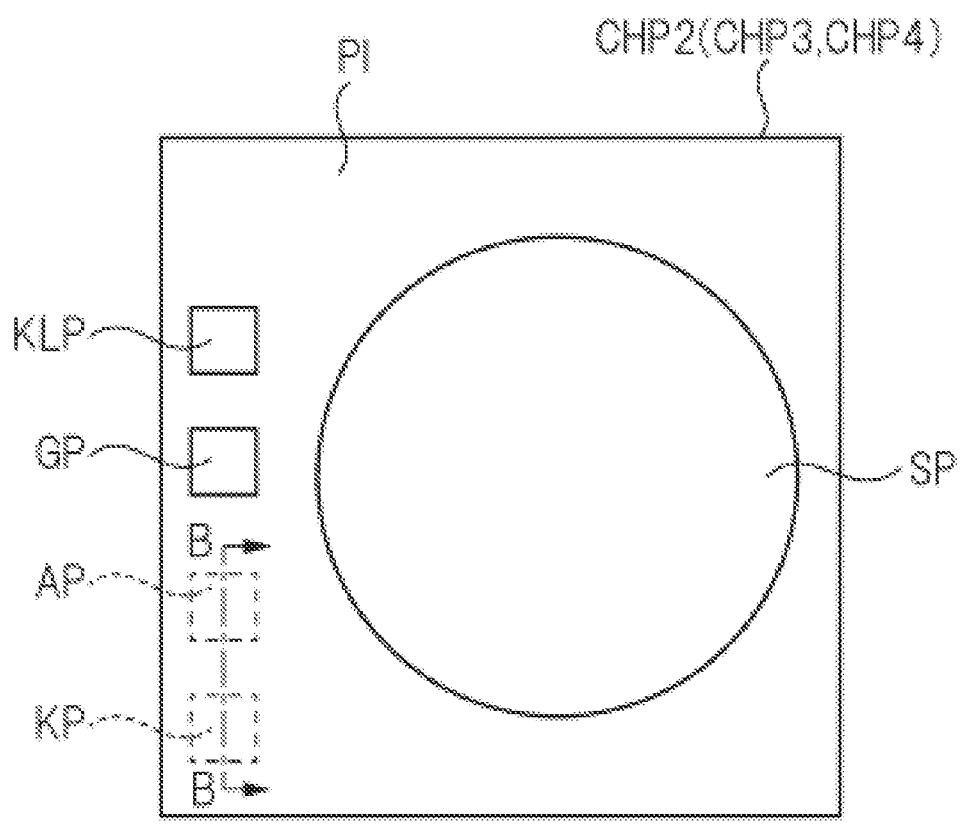
FIG. 13B is a view showing a planar layout of a second semiconductor chip that is a non-built-in chip.

FIG. 13A is a view showing a planar layout of a first semiconductor chip CHP1 that is a built-in chip, and FIG. 13B is a view showing a planar layout of a second semiconductor chip CHP2 (third semiconductor chip CHP3, fourth semiconductor chip CHP4) that is a non-built-in chip.

In FIG. 13A, the first semiconductor chip CHP1 includes a plurality of pads exposed from the polyimide resin film PI. Specifically, a source pad SP, a Kelvin pad KLP, a gate pad GP, an anode pad AP, and a cathode pad KP are provided on the first semiconductor chip CHP1 so as to be exposed from the polyimide resin film PI.

On the other hand, in FIG. 13B, the second semiconductor chip CHP2 includes a plurality of pads exposed from the polyimide resin film PI and a plurality of pads covered with the polyimide resin film PI. Specifically, on the surface of the second semiconductor chip CHP2, the source pad SP, the Kelvin pad KLP, and the gate pad GP are provided so as to be exposed from the polyimide resin film PI, while on the surface of the second semiconductor chip CHP2, the anode pad AP and the cathode pad KP are provided so as to be covered with the polyimide resin film PI.

As described above, in the first semiconductor chip CHP1 which is a built-in chip, the anode pad AP and the cathode pad KP are exposed from the polyimide resin film PI. On the other hand, in the second semiconductor chip CHP2 which is a non-built-in chip, the anode pad AP and the cathode pad KP are covered with the polyimide resin film PI. In this respect, the first semiconductor chip CHP1 and the second semiconductor chip CHP2 have different features in appearance, whereby the first semiconductor chip CHP1 and the second semiconductor chip CHP2 can be distinguished from each other in appearance. That is, in a chip set having a built-in chip and a non-built-in chip, the built-in chip and the non-built-in chip can be distinguished by the presence or absence of exposure of the anode pad AP and the cathode pad KP. As a result, according to the embodiment, it is possible to suppress erroneous recognition between the built-in chip and the non-built-in chip in the assembly manufacturer that provides the chip set.

As described above, since the first semiconductor chip CHP1, which is the built-in chip, includes a temperature sensing diode, the anode pad AP and the cathode pad KP are used. Therefore, in the first semiconductor chip CHP1, the anode pad AP and the cathode pad KP are exposed from the polyimide resin film PI.

On the other hand, since the second semiconductor chip CHP2, which is the non-built-in chip, does not include a temperature sensing diode, the anode pad AP and the cathode pad KP are not used. Therefore, in the second semiconductor chip CHP2, the anode pad AP and the cathode pad KP are covered with the polyimide resin film PI.

Originally, in the second semiconductor chip CHP2, which is the non-built-in chip, since the anode pad AP and the cathode pad KP are not used, it is considered that there is no need to form the anode pad AP and the cathode pad KP. In this regard, for the following reasons, the second semiconductor chip CHP2, which is the non-built-in chip in which no temperature sensing diode is provided, is also provided with an unwanted anode pad AP and cathode pad KP.

That is, in the non-built-in chip, when the anode pad AP and the cathode pad KP are not provided, the non-built-in chip differs from the built-in chip having the anode pad AP and the cathode pad KP in the device configuration. For example, depending on the presence or absence of the anode pad AP and the cathode pad KP, a difference in electric field distribution between the built-in chip and the non-built-in chip, a difference in parasitic capacitance, and the like occur, and consequently, the device properties of the built-in chip and the non-built-in chip are different. That is, since it is desirable that the device characteristics be equal between the built-in chip and the non-built-in chip, it is desirable to avoid the difference in the device characteristics caused by the presence or absence of the anode pad AP and the cathode pad KP as much as possible.

Therefore, in the embodiment, the anode pad AP and the cathode pad KP are also provided in the non-built-in chip from the viewpoint of suppressing the deviation of the device properties even though the anode pad AP and the cathode pad KP are unnecessary in the non-built-in chip. In other words, the technical significance of providing the anode pad AP and the cathode pad KP which are not required in the non-built-in chip is to suppress the deviation of the device properties between the built-in chip and the non-built-in chip due to the presence or absence of the anode pad AP and the cathode pad KP.

Therefore, in the embodiment, the anode pad AP and the cathode pad KP are provided not only in the built-in chip but also in the non-built-in chip, and the anode pad AP and the cathode pad KP are covered with the polyimide resin film PI in the non-built-in chip so that the built-in chip and the non-built-in chip can be visually distinguished from each other. Thus, according to the embodiment, the built-in chip and the non-built-in chip can be distinguished from each other in appearance while suppressing a difference in device characteristics between the built-in chip and the non-built-in chip. Therefore, according to an embodiment, a chip set including a built-in chip and a non-built-in chip that can be visually distinguished from each other can be provided. In other words, according to the embodiment, it is possible to realize a method of providing a chip set capable of suppressing erroneous recognition between a built-in chip and a non-built-in chip.

<<Device Structure>>

First, a device structure of the built-in chip will be described with reference to the drawings.

Figure 14A:
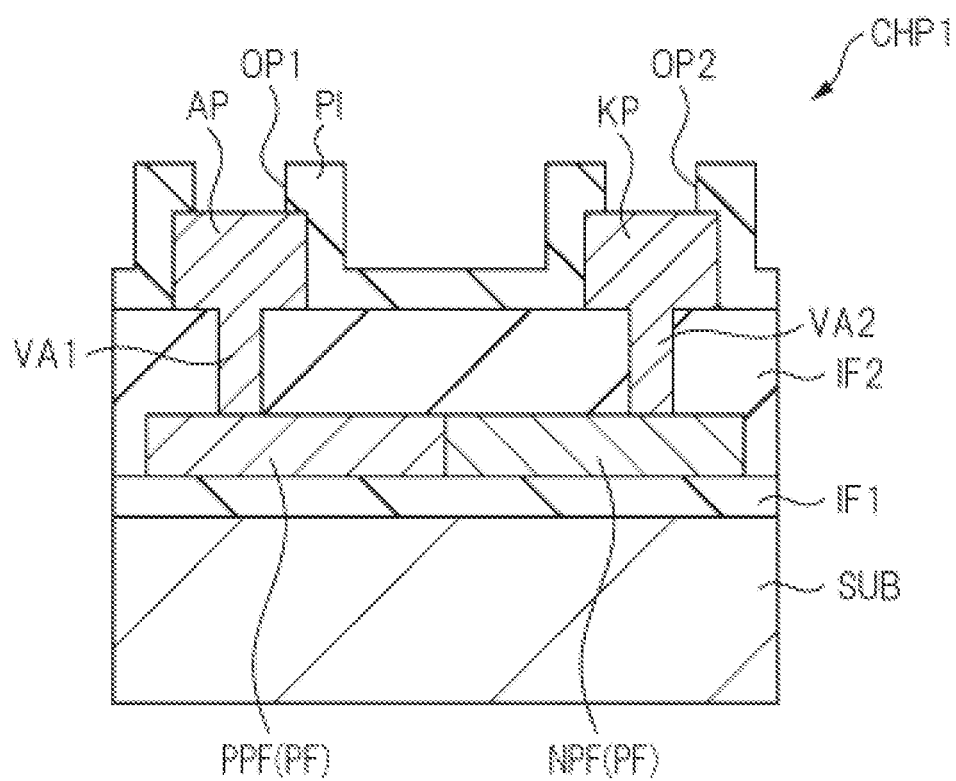
FIG. 14A is a cross-sectional view cut at a line A-A in FIG. 13A.

FIG. 14A is a cross-sectional view cut at a line A-A in FIG. 13A.

In FIG. 14A, the first semiconductor chip CHP1, which is the built-in chip, includes a semiconductor substrate SUB made of, for example, a silicon substrate, an insulating film IF1 formed on the semiconductor substrate SUB, and an insulating film IF2 formed on the insulating film IF1. The first semiconductor chip CHP1 includes an anode pad AP formed on the insulating film IF2, a cathode pad KP formed on the insulating film IF2, and a polyimide resin film PI, which is a protective film, formed on the insulating film IF2. Here, the first semiconductor chip CHP1 further includes the following components (elements). That is, the first semiconductor chip CHP1 includes: a polysilicon film PF that is a semiconductor layer that is a component (element) of the temperature sensing diode, that has a p-type impurity region and an n-type impurity region, and that is formed on the insulating film IF1; a via IF1 that is formed in the insulating film IF2 and that is electrically connecting the anode pad AP and the polysilicon film PF with each other; and a via VA2 that is formed in the insulating film IF2 and that is electrically connecting the cathode pad KP and the polysilicon film PF with each other.

At this time, the via VA1 is connected to the polysilicon film PF at the p-type impurity region, while the via VA2 is connected to the polysilicon film PF at the n-type impurity region. In other words, the polysilicon film PF has a p-type polysilicon film PPF corresponding to the p-type impurity region and an n-type polysilicon film NPF corresponding to the n-type impurity region, and the via VA1 is connected to the p-type polysilicon film PPF, while the via VA2 is connected to the n-type polysilicon film NPF.

As shown in FIG. 14A, in the first semiconductor chip CHP1, the anode pad AP is exposed in the opening portion OP1 of the polyimide resin film PI, and the cathode pad KP is exposed in the opening portion OP2 of the polyimide resin film PI.

As described above, the device structure of the first semiconductor chip CHP1 is realized.

Next, the device structure of the non-built-in chip will be described with reference to the drawings.

Figure 14B:
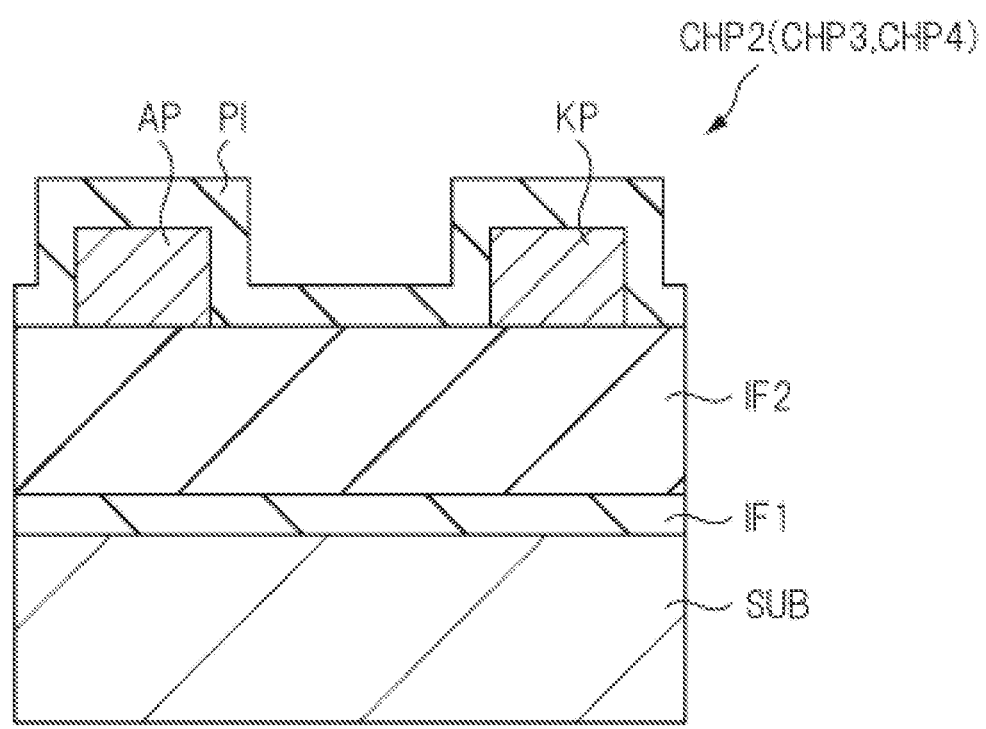
FIG. 14B is a cross-sectional view cut at a line B-B in FIG. 13B.

FIG. 14B is a cross-sectional view cut at line B-B in FIG. 13B.

In FIG. 14B, the second semiconductor chip CHP2, which is a non-built-in chip, includes a semiconductor substrate SUB made of, for example, a silicon substrate, an insulating film IF1 formed on semiconductor substrate SUB, and an insulating film IF2 formed on the insulating film IF1. The second semiconductor chip CHP2 includes an anode pad AP formed on the insulating film IF2, a cathode pad KP formed on the insulating film IF2, and a polyimide resin film PI, which is a protective film, formed on the insulating film IF2.

At this time, as shown in FIG. 14B, in the second semiconductor chip CHP2, each of the anode pad AP and the cathode pad KP is covered with the polyimide resin film PI so as not to be exposed from the polyimide resin film PI.

As described above, the device structure of the second semiconductor chip CHP2 is realized.

In FIG. 14A, since the first semiconductor chip CHP1 having a temperature sensing diode, the first semiconductor chip CHP1 has a polysilicon film PF corresponding to the temperature sensing diode, and the polysilicon film PF is comprised of a p-type polysilicon film PPF and an n-type polysilicon film NPF. In the first semiconductor chip CHP1, the anode pad AP is connected to the p-type polysilicon film PPF via the via VA1, while the cathode pad KP is connected to the n-type polysilicon film NPF via the via VA2.

On the other hand, in FIG. 14B, since the second semiconductor chip CHP2 does not have a temperature sensing diode, a polysilicon film PF corresponding to a temperature sensing diode, a via VA1 connected to the anode pad AP, and a via VA2 connected to the cathode pad KP are not formed in the second semiconductor chip CHP2. That is, in the second semiconductor chip CHP2, each of the anode pad AP and the cathode pad KP functions as a "dummy pad".

The invention made by the present inventor has been described above in detail based on the embodiment, but the present invention is not limited to the embodiment described above, and it is needless to say that various modifications can be made without departing from the gist thereof.

In the above-described embodiment, the power MOSFET is exemplified as a power transistor, but the technical idea in the above-described embodiment is not limited to this, and can be widely applied to a case where a IGBT is used. In this case, the following terms are replaced.

"Source"→"Emitter"
"Source pad"→"Emitter pad"
"Drain"→"Collector"

What is claimed is:

1. A semiconductor device comprising:
a first chip mounting portion;
a second chip mounting portion arranged next to the first chip mounting portion to be spaced apart from the first chip mounting portion in plan view;
a first semiconductor chip mounted on the first chip mounting portion, the first semiconductor chip having a first power transistor and a temperature sensing diode;
a second semiconductor chip mounted on the second chip mounting portion, the second semiconductor chip having a second power transistor, but not having a temperature sensing diode;
a third semiconductor chip mounted on the first chip mounting portion, the third semiconductor chip having a third power transistor, but not having a temperature sensing diode;
a fourth semiconductor chip mounted on the second chip mounting portion, the fourth semiconductor chip having a fourth power transistor, but not having a temperature sensing diode; and
a conductive patterned portion arranged between the first chip mounting portion and the second chip mounting portion,
wherein the second semiconductor chip is electrically connected with the first chip mounting portion via a first plate-shaped member,
wherein the fourth semiconductor chip is electrically connected with the first chip mounting portion via a second plate-shaped member,
wherein the first semiconductor chip is electrically connected with the conductive patterned portion via a third plate-shaped member,
wherein, in plan view, a longitudinal axis of the first plate-shaped member, a longitudinal axis of the second plate-shaped member, and a longitudinal axis of the third plate-shaped member parallel to another while the longitudinal axis of the third plate-shaped member is arranged between the longitudinal axis of the first plate-shaped member and the longitudinal axis of the second plate-shaped member.

2. The semiconductor device according to claim 1,
wherein the semiconductor device is a component of a half-bridge circuit,
wherein the first power transistor is one of a high-side transistor and a low-side transistor each composing the half-bridge circuit, and
wherein the second power transistor is an another one of the high-side transistor and the low-side transistor.

3. The semiconductor device according to claim 2,
wherein each of the first power transistor and the third power transistor is the low-side transistor of the half-bridge circuit,
wherein each of the second power transistor and the fourth power transistor is the high-side transistor of the half-bridge circuit,
wherein the first power transistor is coupled in series with the second power transistor,
wherein the third power transistor is coupled in series with the fourth power transistor,
wherein the first power transistor is coupled in parallel with the third power transistor, and
wherein the second power transistor is coupled in parallel with the fourth power transistor.

4. The semiconductor device according to claim 3,
wherein, in plan view, the first semiconductor chip is arranged between a first portion, to which the first plate-shaped member is connected, of the first chip mounting portion and a second portion, to which the second plate-shaped member is connected, of the first chip mounting portion.

5. The semiconductor device according to claim 4,
wherein the third semiconductor chip is electrically connected with the conductive patterned portion via a fourth plate-shaped member,
wherein the first plate-shaped member straddles the second semiconductor chip and the first chip mounting portion so as not to physically contact the conductive patterned portion,
wherein the second plate-shaped member straddles the fourth semiconductor chip and the first chip mounting portion so as not to physically contact the conductive patterned portion, and
wherein, in plan view, the second plate-shaped member is arranged between the third plate-shaped member and the fourth plate-shaped member.

6. The semiconductor device according to claim 5, further comprising:
a first wide lead integrally formed with the first chip mounting portion;
a second wide lead integrally formed with the first chip mounting portion;
a third wide lead integrally formed with the second chip mounting portion;
a fourth wide lead integrally formed with the second chip mounting portion; and
a plurality of leads arranged so as to be spaced apart from each of the first chip mounting portion and the second chip mounting portion,
wherein, in a plan view, each of the first chip mounting portion and the second chip mounting portion extends in a first direction,
wherein, in a second direction intersecting the first direction, the second chip mounting portion is arranged next to the first chip mounting portion,
wherein, in the second direction, the first wide lead is arranged next to the first semiconductor chip,
wherein, in the second direction, the second wide lead is arranged next to the third semiconductor chip,
wherein, in the second direction, the third wide lead is arranged next to the second semiconductor chip,
wherein, in the second direction, the fourth wide lead is arranged next to the fourth semiconductor chip,
wherein a width of each of the first wide lead, the second wide lead, the third wide lead and the fourth wide lead is greater than a width of each of the plurality of leads.

7. The semiconductor device according to claim 1,
wherein each of the first semiconductor chip and the second semiconductor chip includes:
a semiconductor substrate;
a first insulating film formed on the semiconductor substrate;
a second insulating film formed on the first insulating film;
a first pad formed on the second insulating film;
a second pad formed on the second insulating film; and
a protective film formed on the second insulating film,
wherein the first semiconductor chip further includes:
a semiconductor layer having a first impurity region of a first conductivity type and a second impurity region of a second conductivity type, the semiconductor layer being formed on the first insulating film, and the semiconductor layer being a component of the temperature sensing diode;
a first via formed in the second insulating film, the first via electrically connecting the first pad and the semiconductor layer with each other; and
a second via formed in the second insulating film, the second via electrically connecting the second pad and the semiconductor layer with each other,
wherein the first via is connected to the semiconductor layer at the first impurity region,
wherein the second via is connected to the semiconductor layer at the second impurity region,
wherein, in the first semiconductor chip, the first pad is exposed in a first opening portion of the protective film, and the second pad is exposed in a second opening portion of the protective film, and
wherein, in the second semiconductor chip, each of the first pad and the second pad is covered with the protective film so as not to be exposed from the protective film.

8. The semiconductor device according to claim 7,
wherein the semiconductor layer is a polysilicon film,
wherein the first conductivity type is p-type, and
wherein the second conductivity type is n-type.

* * * * *